United States Patent
Qureshi

(10) Patent No.: US 8,831,047 B1
(45) Date of Patent: Sep. 9, 2014

(54) MULTI-WAVELENGTH LASER

(71) Applicant: King Fahd University of Petroleum and Minerals, Dhahran (SA)

(72) Inventor: Khurram Karim Qureshi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 13/771,054

(22) Filed: Feb. 19, 2013

(51) Int. Cl.
*H01S 3/30* (2006.01)
*H01S 3/10* (2006.01)

(52) U.S. Cl.
CPC .................... *H01S 3/10023* (2013.01)
USPC ........ 372/6; 372/20; 372/23; 372/93; 372/97; 372/106

(58) Field of Classification Search
USPC .............................. 372/6, 20, 23, 93, 97, 106
See application file for complete search history.

(56) References Cited

U.S. PATENT DOCUMENTS

| | | | |
|---|---|---|---|
| 5,239,607 A | 8/1993 | Da Silva et al. | |
| 2005/0271384 A1* | 12/2005 | Lee et al. | 398/13 |
| 2009/0153844 A1 | 6/2009 | Peter et al. | |
| 2009/0174931 A1* | 7/2009 | Huber et al. | 359/340 |

OTHER PUBLICATIONS

Michie, C.; Kelly, A.E.; Armstrong, I.; Andonovic, I.; Tombling, C.; , "An Adjustable Gain-Clamped Semiconductor Optical Amplifier (AGC-SOA)," Lightwave Technology, Journal of, vol. 25, No. 6, pp. 1466-1473, Jun. 2007 (abstract only).
Qureshi, Khurram Karim, Tam, H.Y.., "Mutliwavelength fiber ring laser using a gain clamped semiconductor optical amplifier," Optics & Laser Technology, 44, 1646-1648, Feb. 25, 2012.
Michie et al., An Adjustable Gain-Clamped Semiconductor Optical Amplifiier (AGC-SOA), Journal of Lightwave Technology, vol. 25, No. 6, 1466-1473, Jun. 2007.
Liu et al., "Detailed Theoretical Model for Adjustable Gain-Clamped Semiconductor Optical Amplifier," International Journal of Optics, vol. 2012, 6 pages, Hindawi Publishing Corporation, 2012.

* cited by examiner

*Primary Examiner* — Kinam Park
(74) *Attorney, Agent, or Firm* — Richard C Litman

(57) ABSTRACT

The multi-wavelength laser is a ring laser source working at room temperature. The laser has an inner cavity disposed in an outer cavity. A pair of circulators disposed in the inner cavity is configured to assure counter-propagation of light between the inner cavity and the outer cavity. A gain-clamped semiconductor optical amplifier (GC-SOA) is formed by combining a SOA and a Fiber Fabry-Perot Tunable Filter (FFP-TF) with the circulator pair. This configuration in the laser cavity results in an improvement in terms of transient gain excursions by applying an optical feedback. This attribute of the GC-SOA enables realizing a stable multi-wavelength laser source.

10 Claims, 6 Drawing Sheets

MULTI-WAVELENGTH LASER

BACKGROUND OF THE INVENTION

1. Field of the Invention

The present invention relates to optical laser technology, and particularly to a multi-wavelength laser configured to provide stable multi-lasing over a variety of temperatures and time durations.

2. Description of the Related Art

Fiber ring lasers have been extensively investigated in the recent past. Hitherto, many applications of multi-wavelength fiber lasers have been found in optical fiber sensors, optical communications and optical instrument testing. These light sources are attractive, as their compact size and increased number of wavelengths per component make them very cost-effective. Various methods have been put forward for the generation of such sources. Typically, Erbium-Doped-Fiber (EDF) lasers using a comb filter are seen to be a potential candidate in generating multi-wavelength laser sources, since the EDF provides large gain, high saturation power and a relatively low noise figure. However, due to the homogenous broadening mechanism of the EDF laser at room temperature, the number of lasing modes is limited to generally less than four. In addition, the mode competition leads to fluctuating and unstable laser powers.

Overcoming these issues requires either cooling the EDF with liquid nitrogen or using costly twin-core EDFs, both of which are complex and costly methods, which are not practically viable. One proposal is using a multi-wavelength erbium-doped fiber laser based on inhomogeneous loss mechanism by use of a highly nonlinear fiber and a Fabry-Perot filter. In order to overcome the effect of inhomogeneous line broadening of EDF, a hybrid gain medium has been proposed. The hybrid gain medium consisted of a diode pumped EDF along with a semiconductor optical amplifier in the same cavity. The reported results showed an improvement in terms of mode hopping, compared with the previously reported findings.

Other methods have also been developed to generate multi-wavelength sources, most notably using either Brillouin scattering, or by slicing the amplified spontaneous emission (ASE) from a linear gain medium. Recently, semiconductor optical amplifiers (SOAs) have been the focus of interest for signal amplification in optical networks. SOAs offer many salient features. These devices are compact, lightweight, consume low power, and are easily mass produced and integrated with other optical components on a chip, making it an attractive alternative to fiber-based products. The most important property of the SOA is its dominant inhomogeneous broadening. This property helps in realizing multi-wavelength laser sources employing semiconductor-based gain media suffering from minimum mode competition. It has been proposed to use a conventional SOA as a gain medium for multi-wavelength generation. The result is generating over 40 channels with a channel spacing of 0.5 nm. Yet improvements are still sought.

Thus, a multi-wavelength laser solving the aforementioned problems is desired.

SUMMARY OF THE INVENTION

The multi-wavelength laser is a ring laser source working at room temperature. The laser has an inner cavity disposed in an outer cavity. A pair of circulators disposed in the inner cavity is configured to assure counter-propagation of light between the inner cavity and the outer cavity. A gain-clamped semiconductor optical amplifier (GC-SOA) is formed by combining a semiconductor optical amplifier (SOA) and a Fiber Fabry-Perot Tunable Filter (FFP-TF) where the circulator pair is inside the inner cavity. This configuration in the laser cavity provides an improvement in terms of transient gain excursions by applying optical feedback. This attribute of the GC-SOA enables realizing a stable multi-wavelength laser source.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The multi-wavelength laser is a ring laser source working at room temperature. The configuration is based on a gain-clamped semiconductor optical amplifier (GC-SOA). The performance of a GC-SOA improves, in terms of transient gain excursions, by applying an optical feedback. This attribute of the GC-SOA enables realizing a stable multi-wavelength laser source.

Figure 1:
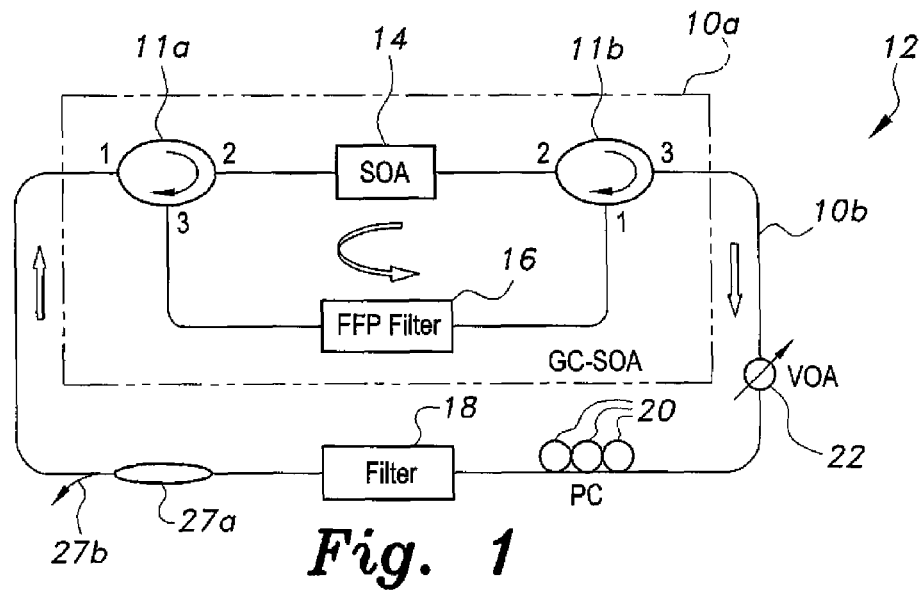
FIG. 1 is a block diagram of a GC-SOA equipped ring laser for a multi-wavelength laser according to the present invention.

As the schematic diagram of FIG. 1 shows, an experimental setup is used to demonstrate the operation of multi-wavelength fiber ring laser 12 at room temperature. The proposed laser source has two cavities. The inner short cavity 10a is incorporated to provide an optical feedback to realize a GC-SOA, whereas the outer cavity 10b serves as the main cavity of the laser source. The exemplary InP/InGaAsP growth-based SOA 14 used in the prototype is manufactured by Samsung Corporation of Korea and is incorporated in the experimental setup to realize a GC-SOA within the inner cavity 10a. The SOA 14 is designed for operation in the C-band (1520-1565 nm). When the SOA 14 is biased at 185 mA, it exhibits a small signal gain of about 18 dB for an input power of −25 dBm at 1550 nm, with a polarization sensitivity of less than 1 dB due to an extremely low facet reflectivity. The 3 dB saturation output power is around 3 dBm when operating at a wavelength of 1550 nm and the device is biased at 180 mA. The noise figure of the SOA, when measured with an input power of −25 dBm at 1550 nm, is around 7.5 dB.

The lengths of the inner short cavity 10a and outer long cavity 10b are, respectively, about 4 m and 7 m. A polarization controller 20 (PC) in the main cavity 10b adjusts the state of polarization in the laser cavity to achieve high signal-to-noise ratio (SNR). A Fiber Fabry-Perot Tunable Filter 16 (FFP-TF) is included in the inner short cavity 10a and is tuned at around 1530 nm to provide a feedback light beam. The light beam at this wavelength provides the tightest transient control and would help reduce the gain competition in a multi-wavelength environment.

The direction of the feedback light beam in the short cavity 10a is established by the two circulators 11a and 11b. The light in this cavity circulates in a counterclockwise direction. The light beam in the main cavity 10b circulates in the clockwise direction, as indicated by the arrows in FIG. 1. The two circulators 11a, 11b in the experimental setup, when connected in this special arrangement, not only determine the direction of feedback light, but also avoid any unwanted reflections from the FFP-TF 16 to the SOA 14. The two counter-propagating beams in the setup ensure that the laser produced by the main cavity has a high SNR. The counterclockwise light beam produced by the short cavity appears at the level of the background noise floor. The main cavity includes a GC-SOA 10a, a PC (polarization controller) 20, a thin film etalon comb filter 18, a variable optical attenuator 22 (VOA), and a 10% fused coupler 27a, which provides an emitted output of multi-wavelength coherent light 27b.

The total insertion loss of the main cavity is estimated to be less than 4 dB. The etalon comb filter introduces an insertion loss of around 1.4 dB. The two circulators introduce an insertion loss of 1 dB each. The laser output is taken from the 10% fused fiber coupler 27a, which fed 90% of the light back into the cavity. The spectrum of the laser output is recorded by an optical spectrum analyzer with a spectral resolution of 0.1 nm.

Figure 2:
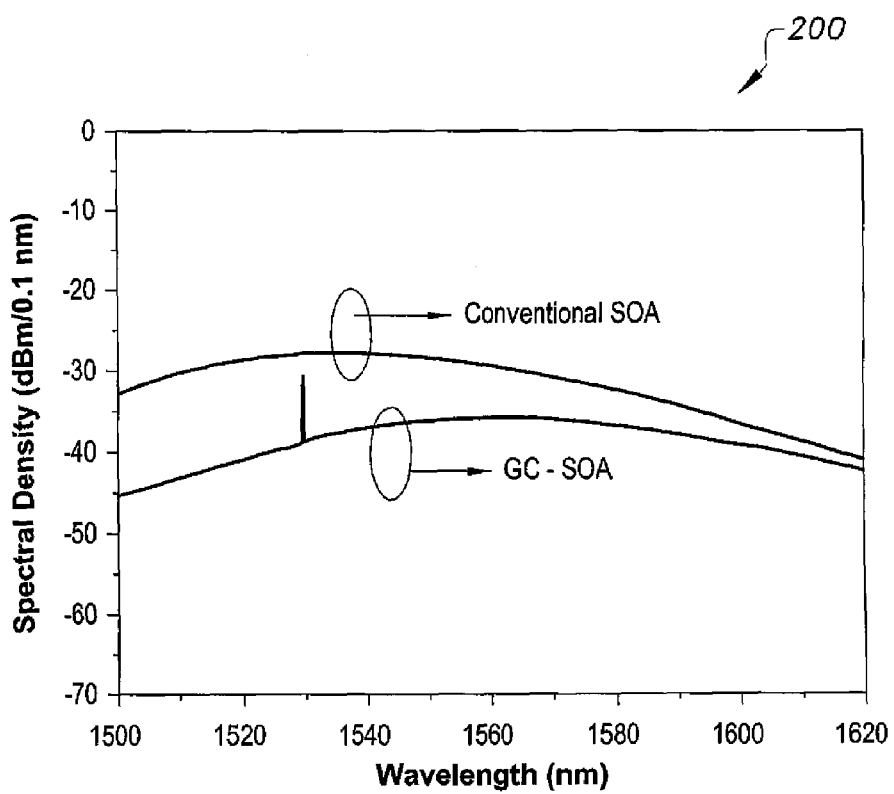
FIG. 2 is a wavelength comparison plot of the GC-SOA of FIG. 1 vs. a conventional SOA.

Plot 200 of FIG. 2 shows a comparison of the Amplified Spontaneous Emission (ASE) spectrum of a conventional SOA with the spectrum of a GC-SOA when biased at 185 mA and thermoelectrically cooled and maintained at 20° C. The 3 dB bandwidth of the conventional SOA is 25 nm, which increases to 35 nm in the case of GC-SOA. The peak of the ASE for the conventional SOA is at 1530 nm, which moves to 1560 nm in the case of GC-SOA.

Figure 3:
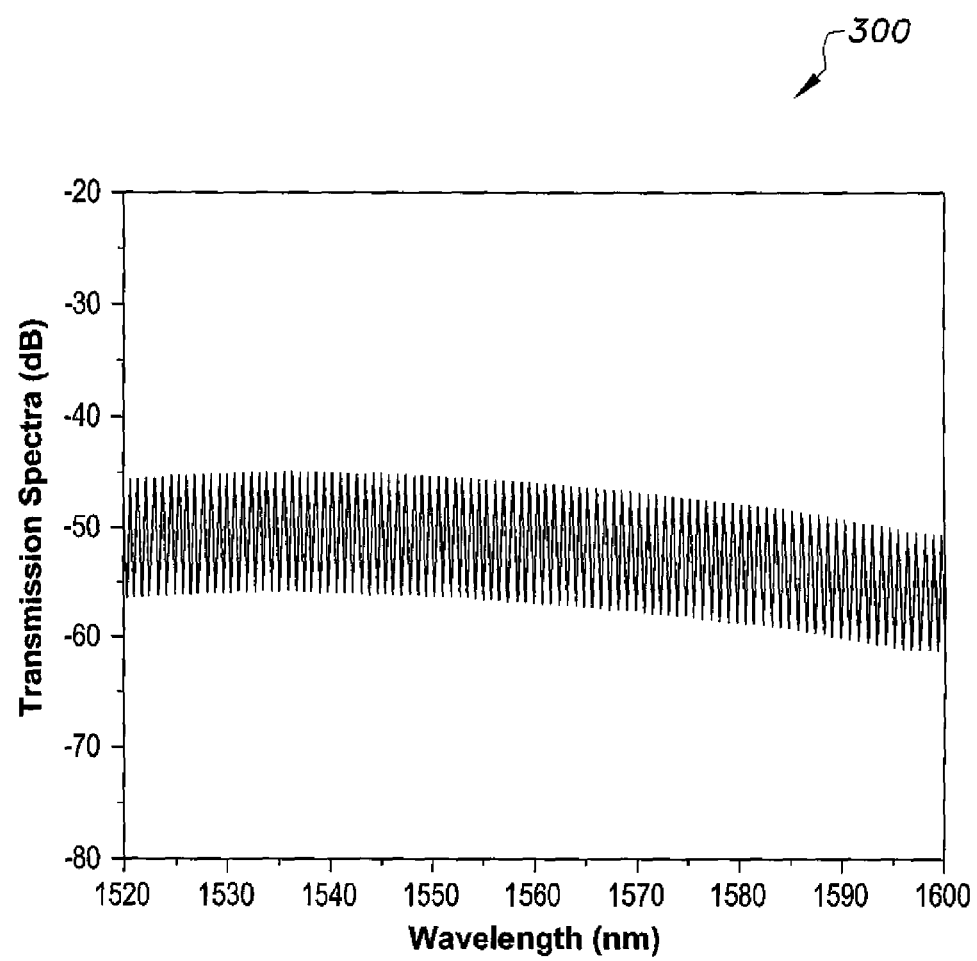
FIG. 3 is a spectrum plot of the GC-SOA equipped laser of FIG. 1.

Plot 300 of FIG. 3 shows the transmission spectrum of the thin film etalon filter incorporated in the main cavity. The thin film etalon comb filter has a Free Spectral Range (FSR) of 0.8 nm (100 GHz) and exhibits an absolute wavelength accuracy of 71.25 GHz over a temperature range from 0° C. to 70° C. The range of operation wavelength of the etalon comb filter is from 1525 nm to 1620 nm. The bandwidth of its wavelength peak is around 0.1 nm, limited by the resolution of the SOA. The extinction ratio of each channel is around 10 dB.

Figure 4:
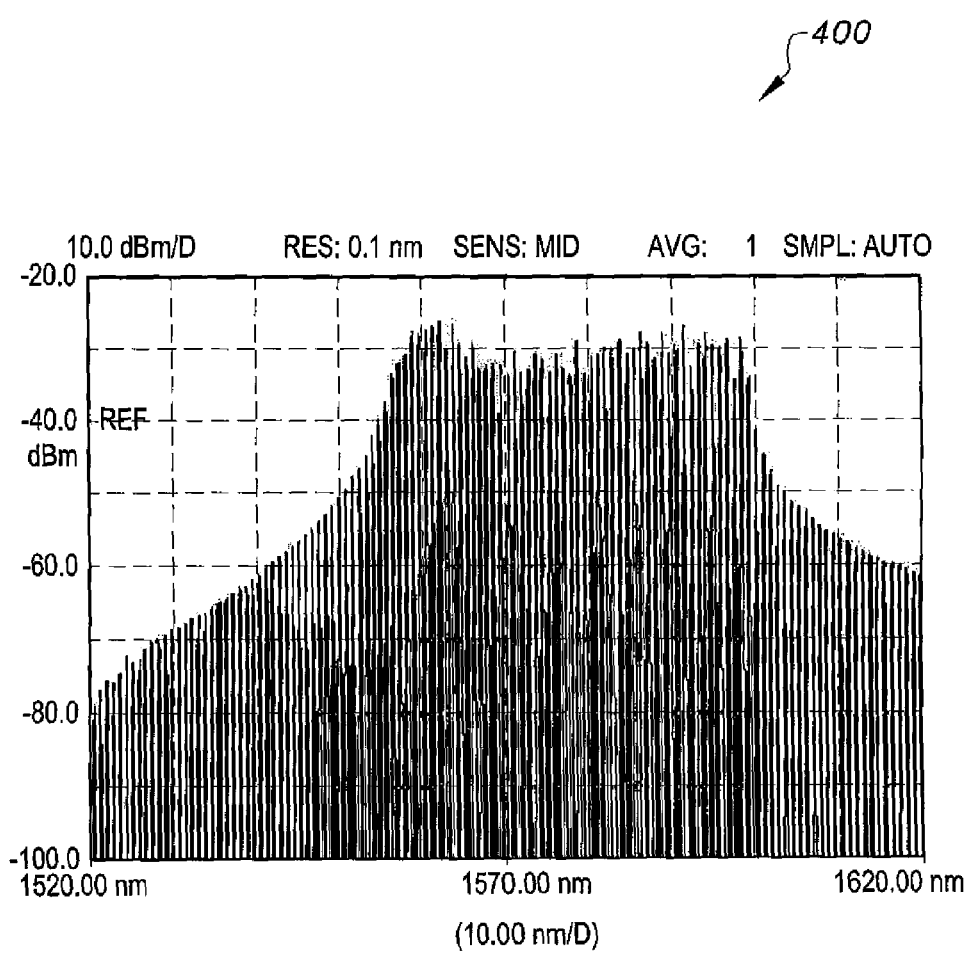
FIG. 4 is a spectrum plot of the GC-SOA equipped laser of FIG. 1 for a first loss value.
Figure 5:
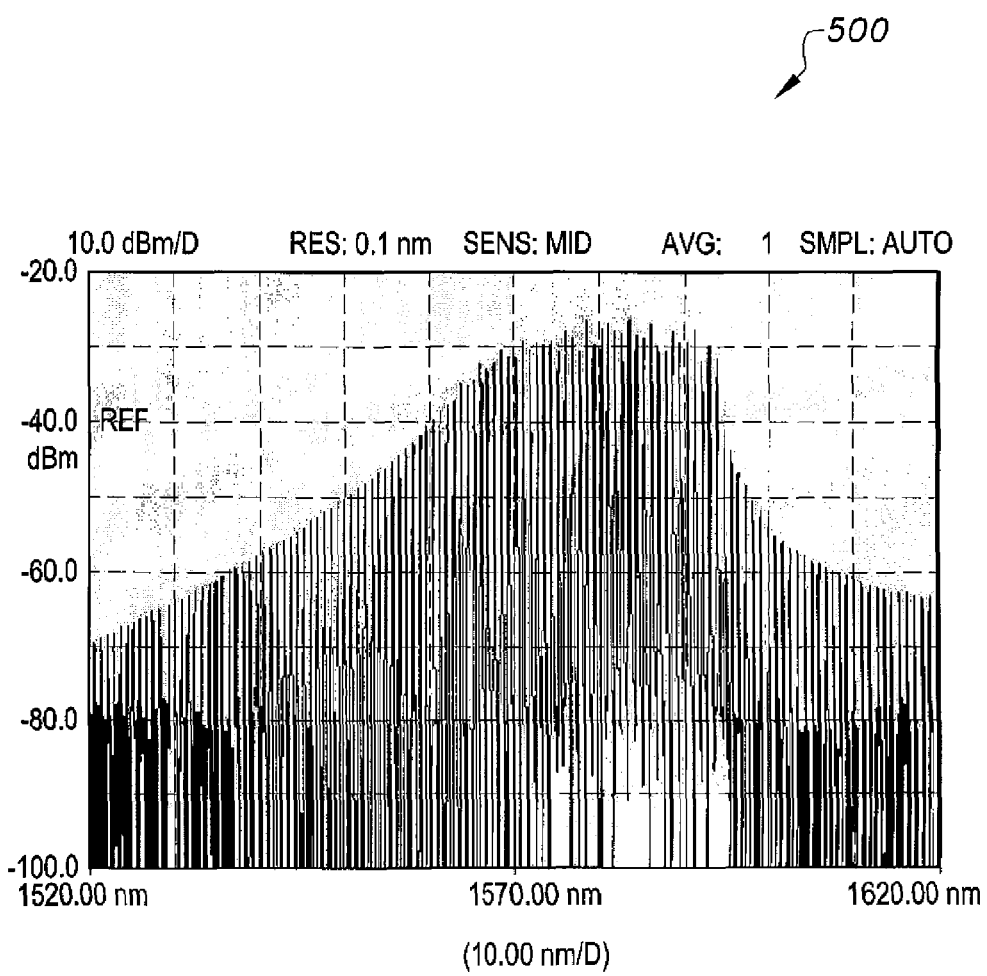
FIG. 5 is a spectrum plot of the GC-SOA equipped laser of FIG. 1 for a second loss value.
Figure 6:
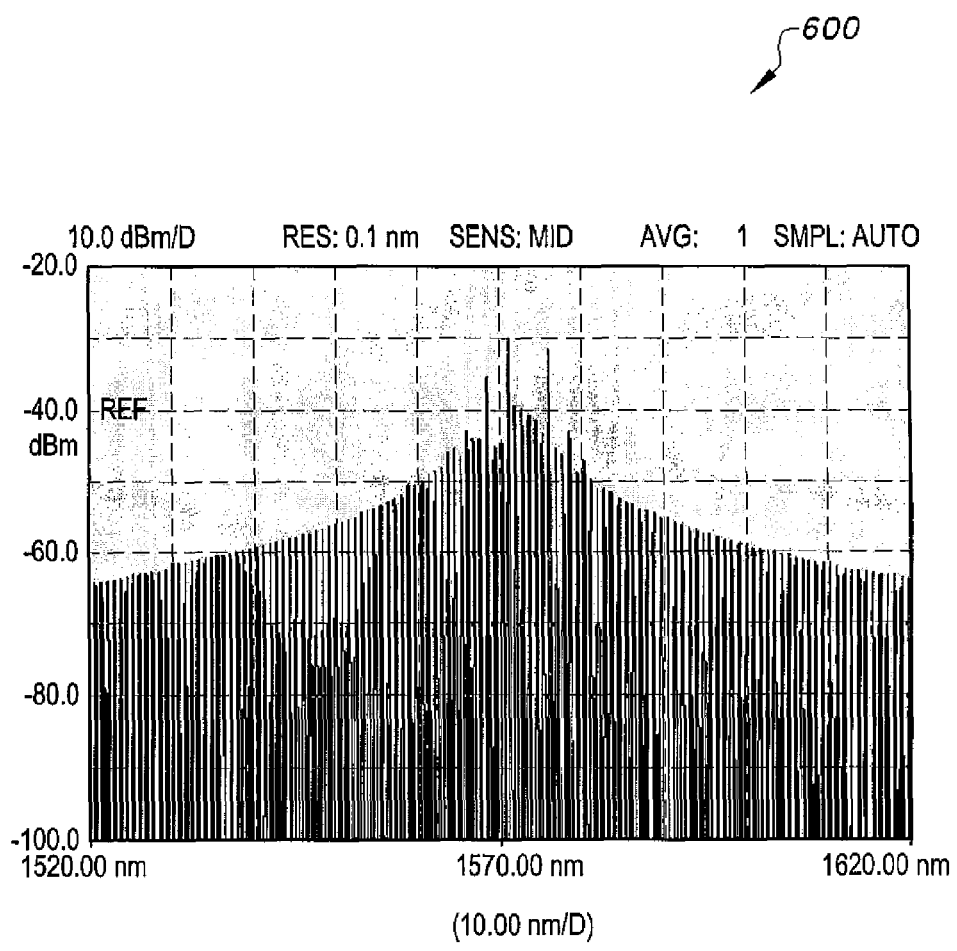
FIG. 6 is a spectrum plot of the GC-SOA equipped laser of FIG. 1 for a third loss value.

Plot 400 of FIG. 4, plot 500 of FIG. 5, and plot 600 of FIG. 6 show the spectra of the multi-wavelength laser source for different values of losses inside the main cavity. The channel spacing between all the generated multi-wavelengths is 0.8 nm (100 GHz), and is established by the comb filter. FIG. 4 shows the spectrum of the multi-wavelength laser output from the 10% fused coupler 27a without incorporating a VOA (variable optical attenuator) inside the cavity. More than 50 lasing lines are generated with an average peak power of around −30 dBm.

The lasing lines are reduced to more than 30 when a loss of 5 dB is introduced in the main cavity through a VOA, as shown in FIG. 5. Finally the lasing lines more or less disappear when the loss in the cavity is increased to 8 dB, as is evident from FIG. 6. The channel is filtered out using a narrow linewidth bandpass filter.

Figure 7:
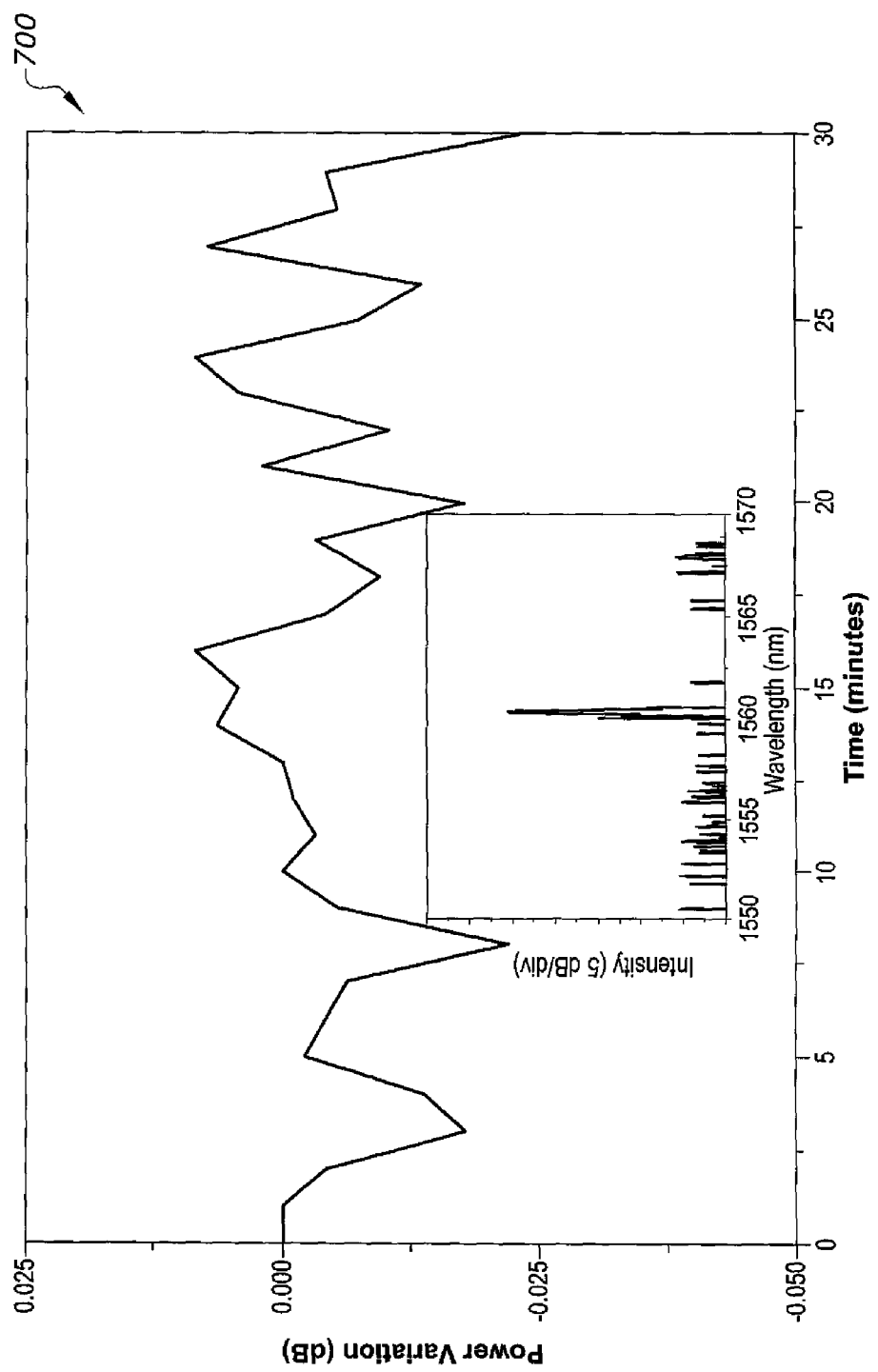
FIG. 7 is a power variation vs. time plot of the GC-SOA equipped laser of FIG. 1.

The short-term stability of the proposed configuration is measured, as shown in plot 700 of FIG. 7. The inset shows the spectrum of a single lasing line obtained after filtering the laser output with a narrow linewidth filter. The lasing wavelength under test is located around 1550 nm, and the observation period is around 30 minutes. Experimental results reveal that the proposed laser has excellent stability. The output power fluctuation was less than ±0.02 dB over 30 minutes of observation.

A simple configuration of a multi-wavelength fiber ring laser based on a gain-clamped semiconductor optical amplifier has been experimentally demonstrated. The proposed laser shows stable operation with total intensity fluctuation for a single laser line within ±0.02 dB at room temperature for a period of 30-minutes.

It is to be understood that the present invention is not limited to the embodiments described above, but encompasses any and all embodiments within the scope of the following claims.

I claim:

1. A multi-wavelength laser, comprising:
a ring multi-wavelength laser having an outer long cavity and an inner short cavity disposed within the outer long cavity;
a pair of circulators disposed inside the inner short cavity;
a Fiber Fabry-Perot Tunable Filter (FFP-TF) and a semiconductor optical amplifier (SOA) operably connected to the circulator pair within the inner short cavity, the filter providing a feedback path and forming a gain-clamped semiconductor optical amplifier (GC-SOA) having an optical output directing first optical signals to the outer long cavity and an optical input accepting second optical signals from the outer long cavity;
a variable optical attenuator (VOA) disposed in the outer long cavity, the variable optical attenuator variably attenuating the first optical signals;
a polarization controller disposed in the outer long cavity and operably connected to the variable optical attenuator, thereby controlling polarization of the variably attenuated first optical signals;
an optical coupler disposed in the outer long cavity, the optical coupler having an input and a split output; and
a filter disposed in the outer long cavity and operably connected to the polarization controller, the filter being configured for filtering the variably attenuated, polarization controlled first optical signals, the filter having an output connected to the optical coupler; and
wherein a first portion of the split output from the optical coupler provides a multi-wavelength coherent beam emitted from the multi-wavelength laser, and a second portion of the split output comprises optical signals retained in the cavities.

2. The multi-wavelength laser according to claim 1, wherein said circulator pair is configured for causing light flowing inside said inner short cavity to flow in a counterclockwise direction and for causing light flowing inside said outer long cavity to flow in a clockwise direction.

3. The multi-wavelength laser according to claim 2, wherein said filter disposed in said outer long cavity is a thin film etalon comb filter.

4. The multi-wavelength laser according to claim 3, wherein said thin film etalon comb filter has a Free Spectral Range (FSR) of about 0.8 nm (100 GHz) and exhibits an absolute wavelength accuracy of approximately 71.25 GHz over a temperature range from about 0° C. to about 70° C.

5. The multi-wavelength laser according to claim 4, wherein the multi-wavelength coherent beam emitted from said multi-wavelength laser comprises more than 50 lasing lines generated with an average peak power of approximately −30 dBm when said VOA is set to zero attenuation.

6. The multi-wavelength laser according to claim 2, wherein said optical coupler disposed in said outer long cavity is a 10% fused fiber coupler, the coupler retaining 90% of the light in said outer long cavity.

7. The multi-wavelength laser according to claim 2, wherein said SOA is biased at between about 180 mA and about 185 mA.

8. The multi-wavelength laser according to claim 2, wherein said inner short cavity has a length of about 4 m.

9. The multi-wavelength laser according to claim 2, wherein said outer long cavity has a length of about 7 m.

10. The multi-wavelength laser according to claim 2, wherein said FFP-TF is tuned at about 1530 nm to provide optical feedback in said inner short cavity.

* * * * *